(12) United States Patent
Tsujino

(10) Patent No.: US 9,491,873 B2
(45) Date of Patent: Nov. 8, 2016

(54) ELEMENT HOUSING PACKAGE, COMPONENT FOR SEMICONDUCTOR DEVICE, AND SEMICONDUCTOR DEVICE

(75) Inventor: Mahiro Tsujino, Higashiomi (JP)

(73) Assignee: Kyocera Corporation, Kyoto (JP)

( * ) Notice: Subject to any disclaimer, the term of this patent is extended or adjusted under 35 U.S.C. 154(b) by 361 days.

(21) Appl. No.: 13/980,552

(22) PCT Filed: May 29, 2012

(86) PCT No.: PCT/JP2012/063779
§ 371 (c)(1),
(2), (4) Date: Jul. 18, 2013

(87) PCT Pub. No.: WO2012/165434
PCT Pub. Date: Dec. 6, 2012

(65) Prior Publication Data
US 2013/0322036 A1    Dec. 5, 2013

(30) Foreign Application Priority Data

May 31, 2011 (JP) ................................. 2011-121243

(51) Int. Cl.
*H05K 5/02* (2006.01)
*H01L 23/057* (2006.01)
(Continued)

(52) U.S. Cl.
CPC ............... *H05K 5/02* (2013.01); *G02B 6/4265* (2013.01); *G02B 6/4274* (2013.01);
(Continued)

(58) Field of Classification Search
CPC  G02B 6/4265; G02B 6/4279; G02B 6/4292; G02B 6/4274; H01L 23/057; H01L 2224/48091; H01L 23/14

USPC ....... 361/730, 752, 760, 764, 799, 807, 810, 361/813, 814; 174/536, 255, 259, 260
See application file for complete search history.

(56) References Cited

U.S. PATENT DOCUMENTS 4,518,982 A * 5/1985 Du Bois ........... H01L 23/49562
257/675
6,384,478 B1 * 5/2002 Pour ............................ 257/724
(Continued)

FOREIGN PATENT DOCUMENTS

JP    04-336702 A    11/1992
JP    2002-368322 A    12/2002
(Continued)

OTHER PUBLICATIONS

English Translation of JP2004055570.*
(Continued)

*Primary Examiner* — Jinhee Lee
*Assistant Examiner* — Abhishek Rathod
(74) *Attorney, Agent, or Firm* — Volpe and Koenig, P.C.

(57) ABSTRACT

An element housing package includes a base body having a rectangular shape, having a mounting region for mounting a semiconductor element, a frame body disposed so as to surround the mounting region, a connection conductor disposed from the upper surface to a lower surface of the base body, a circuit conductor disposed on the lower surface of the base body, one end of the circuit conductor being electrically connected to the connection conductor and an other end of the circuit conductor being drawn out laterally from a first side surface of the base body, and a metal plate bonded to the lower surface of the base body, having an attachment region and a ground conductor region. The metal plate has an outer peripheral region which is drawn out laterally from the base body, from the ground conductor region to the attachment region along an outer periphery of the base body.

6 Claims, 5 Drawing Sheets

(51) Int. Cl.
*G02B 6/42* (2006.01)
*H01L 23/14* (2006.01)

(52) U.S. Cl.
CPC ........ *G02B 6/4279* (2013.01); *G02B 6/4292* (2013.01); *H01L 23/057* (2013.01); *H01L 23/14* (2013.01); *H01L 2224/48091* (2013.01)

(56) References Cited

U.S. PATENT DOCUMENTS

| | | | | |
|---|---|---|---|---|
| 6,936,921 | B2* | 8/2005 | Yoshida | H01L 23/49805 257/531 |
| 7,436,056 | B2* | 10/2008 | Cheung | H01L 23/10 257/698 |
| 7,446,411 | B2* | 11/2008 | Condie et al. | 257/710 |

| | | | |
|---|---|---|---|
| 2004/0080917 | A1 | 4/2004 | Steddom et al. |
| 2005/0098348 | A1 | 5/2005 | Okumichi et al. |
| 2007/0241447 | A1 | 10/2007 | Cheung et al. |

FOREIGN PATENT DOCUMENTS

| | | |
|---|---|---|
| JP | 2003-046180 A | 2/2003 |
| JP | 2004-055570 A | 2/2004 |
| JP | 2004-088067 A | 3/2004 |
| JP | 2007-287916 A | 11/2007 |

OTHER PUBLICATIONS

Extended European Search Report, European Patent Application No. 12792890.1, Apr. 9, 2015, 6 pgs.

* cited by examiner

US 9,491,873 B2

ELEMENT HOUSING PACKAGE, COMPONENT FOR SEMICONDUCTOR DEVICE, AND SEMICONDUCTOR DEVICE

TECHNICAL FIELD

The present invention relates to a semiconductor-element housing package for housing a semiconductor element, a component for a semiconductor device comprising the same and the semiconductor device. The semiconductor-element housing package can be used for various types of electronic apparatuses.

BACKGROUND ART

As the element housing package for housing the semiconductor element (hereinafter also referred to merely as a package), for example, a package described in Patent Literature 1 is known. The package described in Patent Literature 1 includes a package substrate (base body), via-holes (connection conductors) provided from an upper surface to a lower surface of a package substrate and a signal-line metallic thin film (a circuit conductor) provided on the lower surface of the package substrate. The package described in Patent Literature 1 is used by being installed on a mounting board.

Examples of a method of mounting the package on the mounting board include a method of bonding and fixing the package on the mounting board by pressing the package through a bonding member such as a brazing material. Additionally, as described in Patent Literature 2, it is also possible to cite a method of providing fixing members for screwing at four corners or a lower surface of a base body of a package for housing an electronic component and fixing the package on a mounting board by screwing.

However, in the case where the circuit conductor is provided on the lower surface of the base body as the package described in Patent Literature 1, displacement may occur in the circuit conductor at the time of mounting the package on the mounting board.

Specifically, there is a case where slight warping occurs in the base body in a manufacturing process of the package. When the package is pressed on the mounting board in the state where the warping occurs in the base body, the board may be deformed. Accordingly, the circuit conductor installed on the lower surface of the base body may be displaced to a position different from a desired position. As a result, there is a case where impedance matching becomes difficult between the package and the mounting board.

CITATION LIST

Patent Literature

Patent Literature 1: Japanese Unexamined Patent Publication JP-A 4-336702 (1992)
Patent Literature 2: Japanese Unexamined Patent Publication JP-A 2002-368322

SUMMARY OF INVENTION

An element housing package according to one aspect of the invention includes a base body having a rectangular shape when seen in a plan view, having a mounting region for mounting a semiconductor element, a frame body disposed on an upper surface of the base body so as to surround the mounting region, a connection conductor disposed from the upper surface to a lower surface of the base body, a circuit conductor disposed on the lower surface of the base body, one end of the circuit conductor being electrically connected to the connection conductor and an other end of the circuit conductor being drawn out laterally from a first side surface of the base body, and a metal plate bonded to the lower surface of the base body, having an attachment region which is drawn out laterally from a second side surface adjacent to the first side surface of the base body to be attached to a mounting board, and a ground conductor region which is drawn out laterally from the first side surface of the base body so as to be parallel to the circuit conductor. The metal plate further has an outer peripheral region which is drawn out laterally from the base body, from the ground conductor region to the attachment region along an outer periphery of the base body when seen in a plan view.

DESCRIPTION OF EMBODIMENTS

Figure 1:
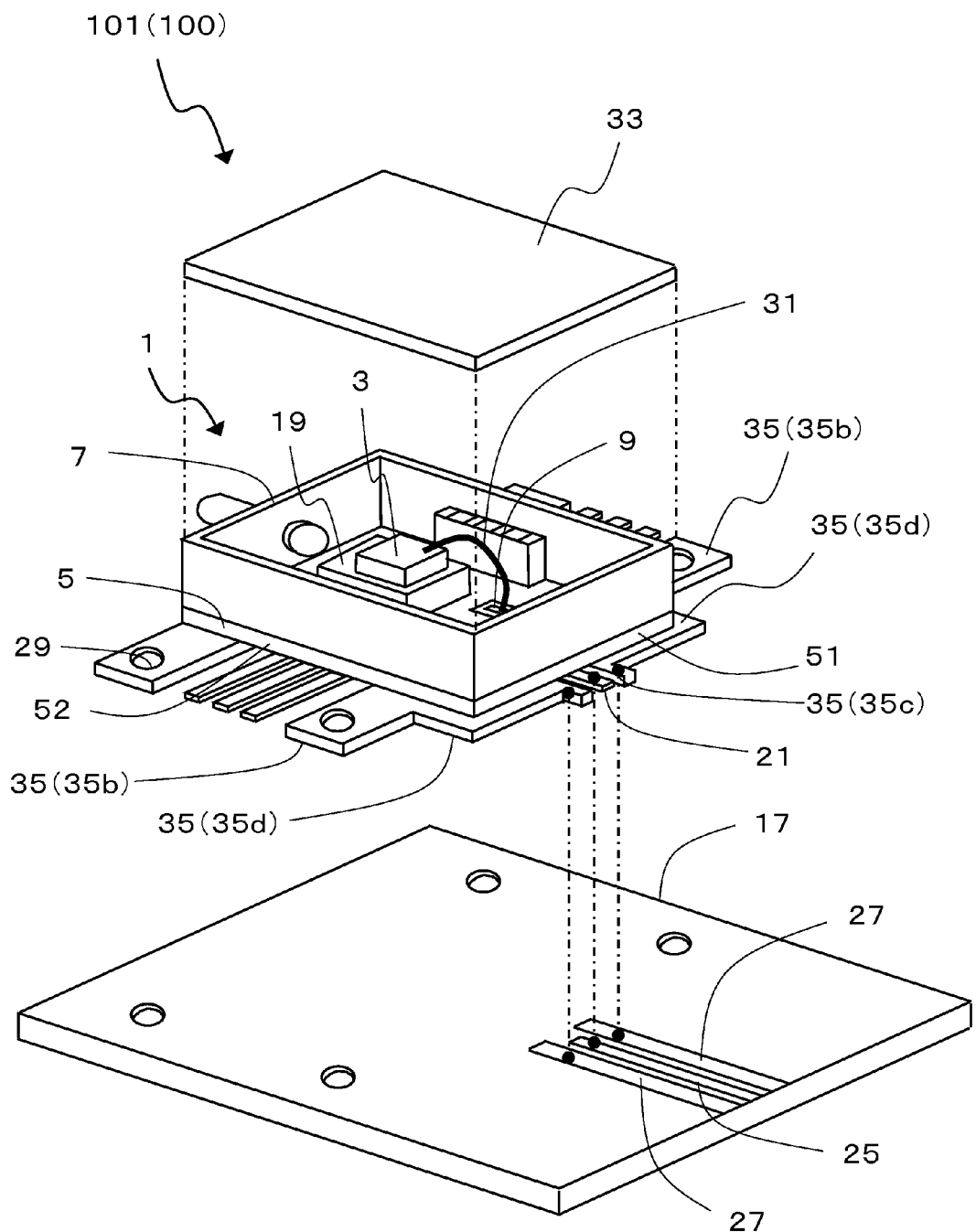
FIG. 1 is an exploded perspective view showing an element housing package, a component for a semiconductor device having the same and a semiconductor device according to a first embodiment.
Figure 2:
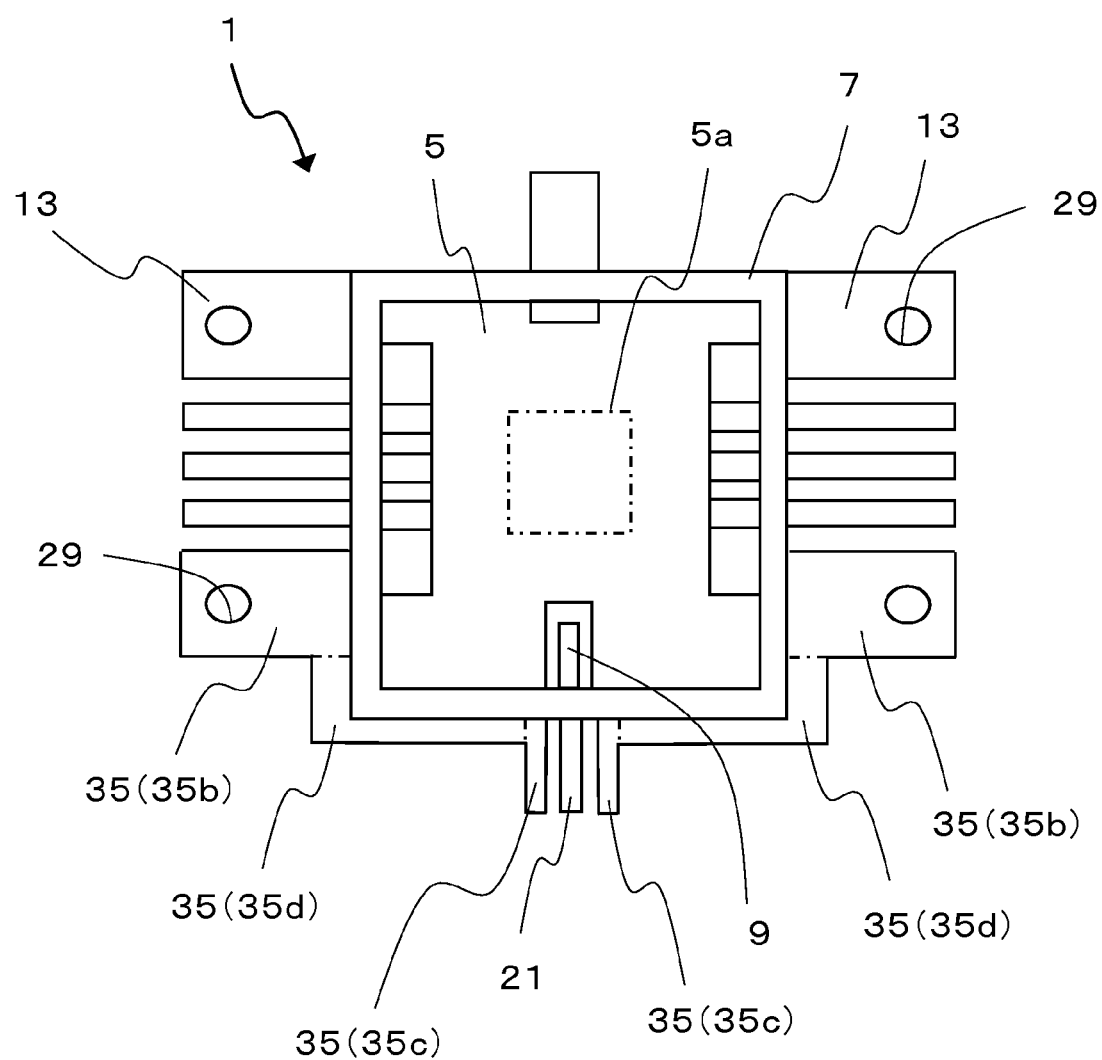
FIG. 2 is a plan view of the element housing package shown in FIG. 1.
Figure 3:
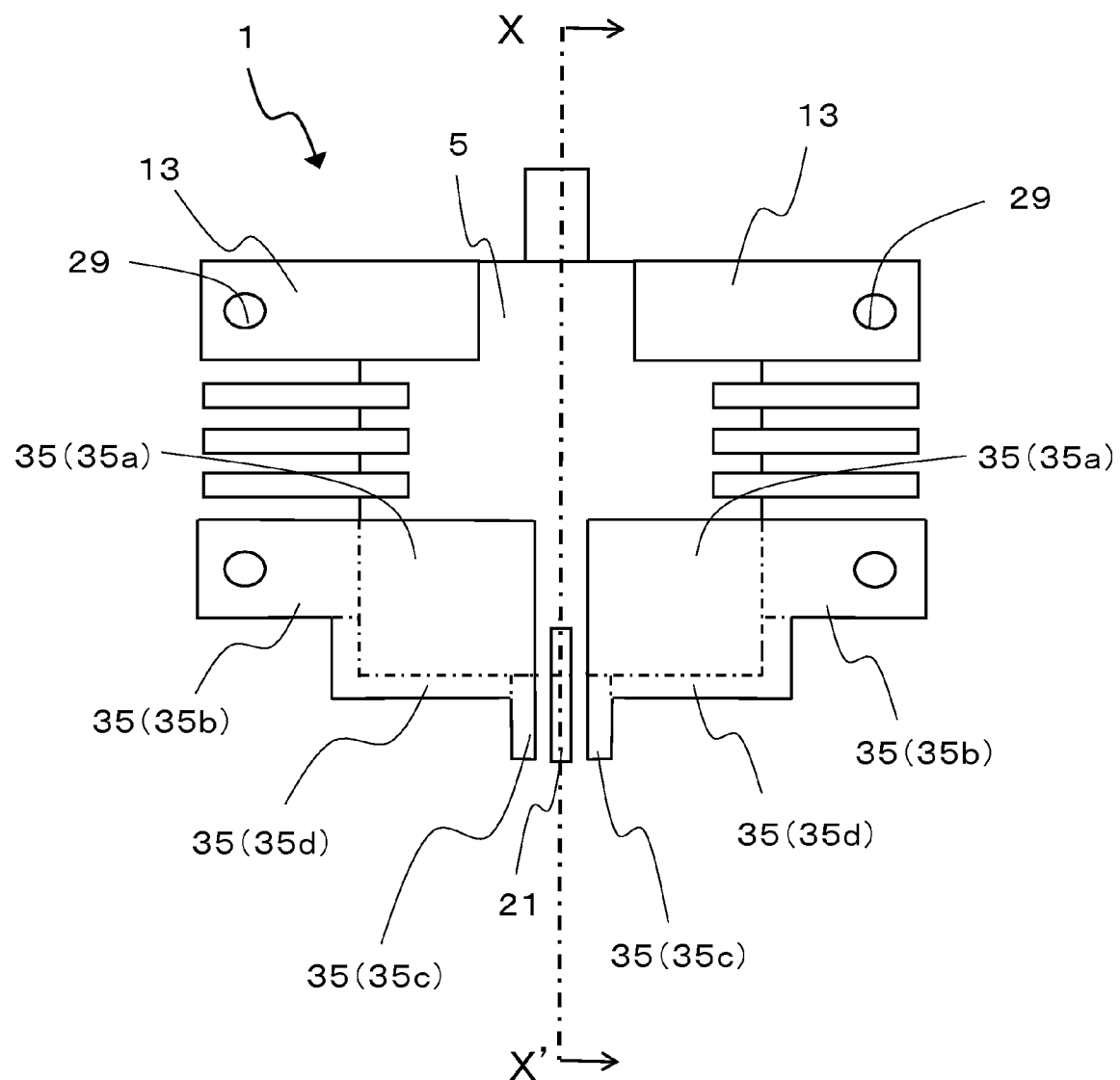
FIG. 3 is a bottom view of the element housing package shown in FIG. 1.
Figure 4:
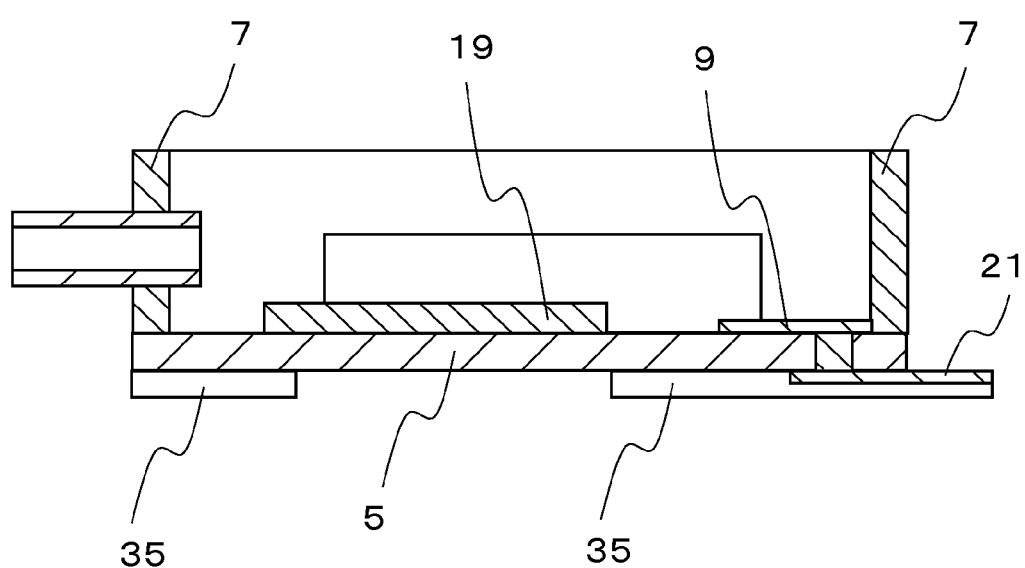
FIG. 4 is a cross-sectional view taken along the line X-X' of the element housing package shown in FIG. 3.

Hereinafter, an element housing package (hereinafter also referred to merely as a package), a component for a semiconductor device having the semiconductor housing package and a semiconductor device according to the respective embodiments will be described in detail with reference to the drawings. The respective drawings referred to below are shown by simplifying only major members necessary for explaining the present invention in component members of the embodiment for convenience of explanation. Therefore, the package, the component for a semiconductor device and the semiconductor device may include optional component members which are not shown in the respective drawings referred to in the specification.

As shown in FIGS. 1 to 4, an element housing package 1 according to the embodiment includes a base body 5 having a mounting region 5a for mounting a semiconductor element 3, a frame body 7 disposed on an upper surface of the base body 5 so as to surround the mounting region 5a, a connection conductor 9 disposed from an inner side of the frame body 7 on the upper surface of the base body 5 to a lower surface thereof, to which the semiconductor element 3 is electrically connected, a circuit conductor 21 and two metal plates 35 respectively disposed on the lower surface of the base body 5. The connection conductor 9 is electrically connected to the semiconductor element 3 through a bonding wire 31 on a portion positioned on the upper surface of the base body 5.

One end of the circuit conductor 21 is electrically connected to the connection conductor 9 and the other end of the circuit conductor 21 is drawn out laterally from a first side surface 51 of the base body 5. The two metal plates 35 respectively has a junction region 35a which is bonded to the lower surface of the base body 5, an attachment region 35b which is drawn out laterally from a second side surface 52 of the base body 5 to be attached to a mounting board 17, a ground conductor region 35c which is drawn out laterally from the first side surface 51 of the base body 5 so as to be parallel to the circuit conductor 21 and an outer peripheral region 35d which is drawn out laterally from the ground conductor region 35c to the attachment region 35b when seen in a plan view. In other words, the outer peripheral region 35d is drawn out laterally from the first side surface and the second side surface. The "second side surface 52" referred to in this case does not mean only one side surface in side surfaces of the base body 5 but two side surfaces adjacent to the first side surface 51.

As the ground conductor region 35c, the attachment region 35b and the outer peripheral region 35d are integrally formed as described above, the strength of the metal plates 53 can be improved. The metal plates 35 whose strength has been improved are provided on the lower surface of the base body 5, thereby enabling the base body 5 to be hard to be deformed. Accordingly, the possibility that the base body 5 is deformed can be suppressed even when the package 1 is pressed against the mounting board 17. Accordingly, it is possible to suppress the possibility that the circuit conductor 21 attached to the lower surface of the base body 5 is displaced to a position different from a desired position. As a result, impedance matching can be easily performed between the package 1 and the mounting board 17.

Furthermore, the attachment region 35b and the outer peripheral region 35d are connected in the metal plates 35. Accordingly, the possibility that the stress is concentrated into a part of the base body 5 at the time of mounting the package 1 on the mounting board 17 can be suppressed. Specifically, in the case where there is a gap between the outer peripheral region 35d and the attachment region 35b, the stress is concentrated into a region where the attachment region 35b is drawn out in a peripheral portion of the base body 5 when the attachment region 35b is screwed to the mounting board 17. However, in the package 1 according to the present embodiment, the stress is distributed to two regions which are a boundary portion between the attachment region 35b and the outer peripheral region 35d, and a region where the attachment region 35b is drawn out in the peripheral portion of the base body 5. Accordingly, the possibility that the base body 5 is deformed can be suppressed.

The base body 5 in the present embodiment has a quadrangular-plate shape, including the mounting region 5a on a main surface of which the semiconductor element 3 is placed. The mounting region 5a in the present embodiment means a region overlapping with the semiconductor element 3 in a plan view of the base body 5. When the base body 5 has a flat plate shape, the size thereof can be set to, for example, 5 mm or more and 50 mm or less on a side. The thickness of the base body 5 can be set to, for example, 0.2 mm or more and 2 mm or less.

Though the mounting region 5a is formed on the center of the main surface in the present embodiment, it is no problem that the mounting region 5a is formed, for example, on an end portion of the main surface of the base body 5 as the region on which the semiconductor element 3 is placed is the mounting region 5a. Additionally, the base body 5 in the present embodiment has one mounting region 5a, however, the base body 5 may have a plurality of mounting regions 5a and the semiconductor elements 3 may be placed on the respective mounting regions 5a.

The semiconductor element 3 is arranged in the mounting region 5a on the main surface of the base body 5. Input/output of signals can be performed between the semiconductor element 3 and an external electric circuit (not shown) through an input/output terminal or the like. Since the semiconductor element 3 is arranged on the main surface of the base body 5 in this manner, it is required that at least a portion where the semiconductor element 3 is arranged in the base body 5 has high insulation performance. The base body 5 according to the embodiment is fabricated by stacking a plurality of insulating members. Then, the semiconductor element 3 is placed on the mounting region 5a of the base body 5. As the insulating members, for example, ceramic materials such as an aluminum oxide sintered compact, a mullite sintered compact, a silicon carbide sintered compact, an aluminum nitride sintered compact or a silicon nitride sintered compact, or glass ceramic materials can be used.

Material powder including these glass power and ceramic powder, an organic solvent and binder are mixed to thereby fabricate a mixture. The mixture is shaped into a sheet state to thereby fabricate a plurality of ceramic green sheets. The plurality of fabricated ceramic green sheets are stacked to thereby fabricate a plurality of stacked bodies. The stacked bodies are integrally fired at a temperature of approximately 1600° C. to thereby fabricate the base body 5. The base body 5 is not limited to such a structure that a plurality of insulating members are stacked. The base body 5 may be formed of one insulating member.

The semiconductor element 3 may be directly mounted on the upper surface of the base body 5, and a placing board 19 for placing the semiconductor element 3 which is arranged on the mounting region 5a of the base body 5 may be provided and the semiconductor element 3 may be mounted on the placing board 19 as in the package 1 according to the embodiment. Members having high insulation performance are preferably used for the placing board 19 in the same manner as the insulating members which are, for example, ceramic materials such as an aluminum oxide sintered compact, a mullite sintered compact, a silicon carbide sintered compact, an aluminum nitride sintered compact or a silicon nitride sintered compact, or glass ceramic materials can be used.

The package 1 according to the embodiment has the frame body 7 disposed on the upper surface of the base body 5 so as to surround the mounting region 5a. As the frame body 7, for example, ceramic materials such as an aluminum oxide sintered compact, a mullite sintered compact, a silicon carbide sintered compact, an aluminum nitride sintered compact or a silicon nitride sintered compact, or glass ceramic materials can be used in the same manner as the base body 5. In addition to the members having high insulation performance, metal members such as iron, copper, nickel, chrome, cobalt or tungsten, or alloys including these metals can be used. The metal members forming the frame body 7 can be fabricated by performing metal processing such as rolling processing or punching processing, to an ingot of the above metal member. The frame body 7 may be made of one member or may have a multilayer structure of a plurality of members.

The element housing package 1 according to the embodiment has a bonding member (not shown) positioned between the base body 5 and the frame body 7 to bond the base body 5 to the frame body 7. As the bonding member, for example, a brazing material can be used. Examples of an illustrative brazing material include a silver alloy brazing material.

The package 1 according to the present embodiment has a plurality of connection conductors 9 disposed from the upper surface to the lower surface of the base body 5. The connection conductors 9 has a function of transmitting an electric signal generated by the semiconductor element 3 from the upper surface to the lower surface of the base body 5 or a function of transmitting an electric signal inputted from the outside from the lower surface to the upper surface of the base body 5. The respective one ends of the plurality of connection conductors 9 are exposed on the upper surface of the base body 5. The respective other ends of the plurality of connection conductors 9 are exposed on the lower surface of the base body 5.

Though the connection conductors 9 according to the present embodiment are electrically connected to the semiconductor element 3 through the bonding wires 31, the invention is not limited to the structure. For example, the connection conductors 9 may be wired to the mounting region 5a on the upper surface of the base body 5 and may be directly connected to the semiconductor element 3 without using the bonding wires 31.

It is preferable to use members having high conductivity as the connection conductors 9. Specifically, metal materials such as tungsten, molybdenum, nickel, manganese, copper, silver or gold can be used as the connection conductors 9. The above metal materials may be used alone, and may be used as an alloy thereof.

Examples of a method of forming the connection conductor 9 include a method of forming a through hole piercing between the upper surface and the lower surface of the base body 5 and disposing a metal paste in the through hole. As a method of disposing the metal paste in the through hole, a well-known suction method or the like may be used. The connection conductor 9 may be formed so that the metal material is filled into the entire inside of the through hole. The metal material may cover an inner wall of the through hole so that a hollow is formed on the inner peripheral side.

The circuit conductor 21, the metal plates 35 and attachment members 13 are respectively disposed on the lower surface of the base body 5.

The metal plate 35 according to the present embodiment has the junction region 35a, the attachment region 35b, the ground conductor region 35c and the outer peripheral region 35d. A plate-shaped metal member can be used as the metal plate 35. As metal materials forming the metal member, metal materials such as copper can be used. The thickness of the metal plate 35 can be set to, for example, 0.1 mm or more and 1 mm or less.

The package 1 according to the present embodiment includes the circuit conductor 21 and a pair of ground conductor regions 35c positioned so as to sandwich the circuit conductor 21. One end of the circuit conductor 21 is electrically connected to the connection conductor 9 and the other end of the circuit conductor 21 is drawn out laterally from the base body 5. The circuit conductor 21 is provided for connecting the connection conductor 9 to a wiring circuit 25 disposed on the mounting board 17. The pair of the ground conductor regions 35c is electrically connected to ground wirings 27 arranged on the mounting board 17. The pair of the ground conductor regions 35c is drawn out from the first side surface 51 in the same direction as the circuit conductor 21. The circuit conductor 21 and the pair of ground conductor regions 35c form a coplanar line.

Note that "earth" and "ground" referred to in this case mean that electrical connection to an external reference potential (not-shown) as a so-called earth potential, and it is not always necessary that the reference potential is 0 V.

In the present embodiment, a strip-shaped metal member is used as the circuit conductor 21. The circuit conductor 21 is made of, for example, metal materials such as copper.

Attachment of the circuit conductor 21 to the lower surface of the base body 5 is performed by bonding the connection conductor 9 and the circuit conductor 21 by the brazing material or the like. The thickness of the circuit conductor 21 can be set to, for example, 0.05 mm or more and 0.5 mm or less.

The attachment regions 35b in the embodiment have a rectangular shape respectively when seen in a plan view. The attachment regions 35b are provided with through holes (screwing holes) 29 for screwing on the mounting board 17. The package 1 can be fixed to the mounting board 17 by screwing the package 1 onto the mounting board 17 by the screwing holes 29. Since the package is fixed to the mounting board 17 firmly at this time, pressing force is applied toward the mounting board 17.

The bonding of the bonding regions 35a of the metal plates 35 to the lower surface of the base body 5 is performed by separately forming a metal film on the lower surface of the base body 5 by a metallizing method and bonding the bonding regions 35a of the metal plates 35 by using a brazing material or the like.

The attachment members 13 have a rectangular shape respectively when seen in a plan view. The attachment members 13 have through holes (screwing holes) 29 for screwing on the mounting board 17. The package 1 can be fixed to the mounting board 17 by screwing the package 1 onto the mounting board 17 by the screwing holes 29. Since the package is fixed to the mounting board 17 firmly at this time, pressing force is applied toward the mounting board 17.

The bonding of the attachment members 13 to the lower surface of the base body 5 is performed by separately forming a metal film on the lower surface of the base body 5 by a metallizing method and bonding the attachment members 13 to the metal film by using a brazing material or the like. A plate-shaped metal member can be used as the attachment members 13. As metal materials forming the metal member, metal materials such as copper can be used in the same manner as the circuit conductor 21 and the metal plates 35. The thickness of the attachment member 13 can be set to, for example, 0.1 mm or more and 1 mm or less.

In the package 1 according to the present embodiment, the package 1 is fixed to the mounting board 17 by the screwing holes 29 provided in the attachment regions 35b and the attachment members 13, however, the invention is not limited to the structure. For example, the lower surface of the attachment regions 35b may be bonded to the upper surface of the mounting board 17 by using the brazing material or the like.

It is preferable that the thickness of the metal plates 35 is larger than the thickness of the circuit conductor 21. Specifically, the thickness of the metal plates 35 is preferably 1.5 to 3 times as large as the thickness of the circuit conductor 21. Additionally, the difference between the metal plates 35 and the circuit conductor 21 is 0.05 to 0.5 mm. Since the thickness of the metal plates 35 is larger than the thickness of the circuit conductor 21, a height position of the lower surface of the circuit conductor 21 will be higher than a height position of the lower surface of the metal plates 35. As a result, it is possible to reduce the force to be applied to the circuit conductor 21 when the package 1 is mounted on the mounting board 17.

Moreover, widths of the outer peripheral regions 35d in a direction drawn out laterally are smaller than widths of the attachment regions 35b and the ground conductor regions 35c, respectively, in a direction drawn out laterally. Since the widths of the outer peripheral regions 35d in the direction drawn out laterally are smaller than the widths of the attachment regions 35b respectively in the direction drawn out laterally, it is possible to prevent the outer peripheral regions 35d from interfering with the installation of the attachment regions 35b to the mounting board 17.

Also, since the widths of the outer peripheral regions 35d in the direction drawn out laterally are smaller than the widths of the ground conductor regions 35c respectively in the direction drawn out laterally, it is possible to suppress the brazing material to spread in a wide range of the outer peripheral regions 35d at the time of electrically connecting the ground conductor regions 35c to ground wirings 27 arranged on the mounting board 17, and therefore, the ground conductor regions 35c can be electrically connected to the ground wirings 27 in a stable manner.

A component for a semiconductor device 100 according to the present embodiment includes the package 1 and the mounting board 17 for mounting the package 1 thereon by attaching the attachment regions 35b, which are typified by the above embodiment, to the mounting board 17. As has been shown, the package 1 is fixed to the mounting board 17 by the screwing holes 29 provided in the attachment regions 35b and the attachment members 13.

Additionally, the semiconductor device 101 according to the present embodiment includes the component for the semiconductor device 100, the semiconductor element 3 mounted on the mounting region 5a of the package 1 in the component for the semiconductor device 100 and a lid body 33 sealing the semiconductor element 3, which is bonded to the upper surface of the frame body 7.

In the semiconductor device 101 according to the present embodiment, the semiconductor element 3 is placed on the mounting region of the substrate. The semiconductor element 3 and the circuit conductor 21 are connected by the bonding wire 31. An external signal is inputted to the semiconductor element 3 through the connection conductor 9 or the like, thereby obtaining a desired output from the semiconductor element 3. Examples of the semiconductor element 3 include a light emitting element which emits light with respect to an optical fiber, which is typified by an LD element, and a light receiving element which receives light with respect to the optical fiber, which is typified by a PD element.

The lid body 33 is configured to be bonded to the frame body 7 so as to seal the semiconductor element 3. The lid body 33 is bonded to an upper surface of the frame body 7. Then, the semiconductor element 3 is sealed in a space surrounded by the base body 5, the frame body 7 and the lid body 33. The semiconductor element 3 is sealed as described above, thereby suppressing deterioration of the semiconductor element 3 by the use of the package 1 for a long period of time. As the lid body 33, metal members such as iron, copper, nickel, chromium, cobalt or tungsten, or alloys including these metals can be used. The frame body 7 and the lid body 33 can be bonded by using, for example, a seam welding method. The frame body 7 and the lid body 33 may be bonded by using, for example, a gold-tin brazing material.

Next, the element housing package 1, the component for the semiconductor device 100 having the same and the semiconductor device 101 according to a second embodiment will be described in detail with reference to the drawings. In the component according to the present embodiment, the component having the same functions as the first embodiment are denoted by the same reference numerals, and the detailed description thereof will be omitted.

Figure 5:
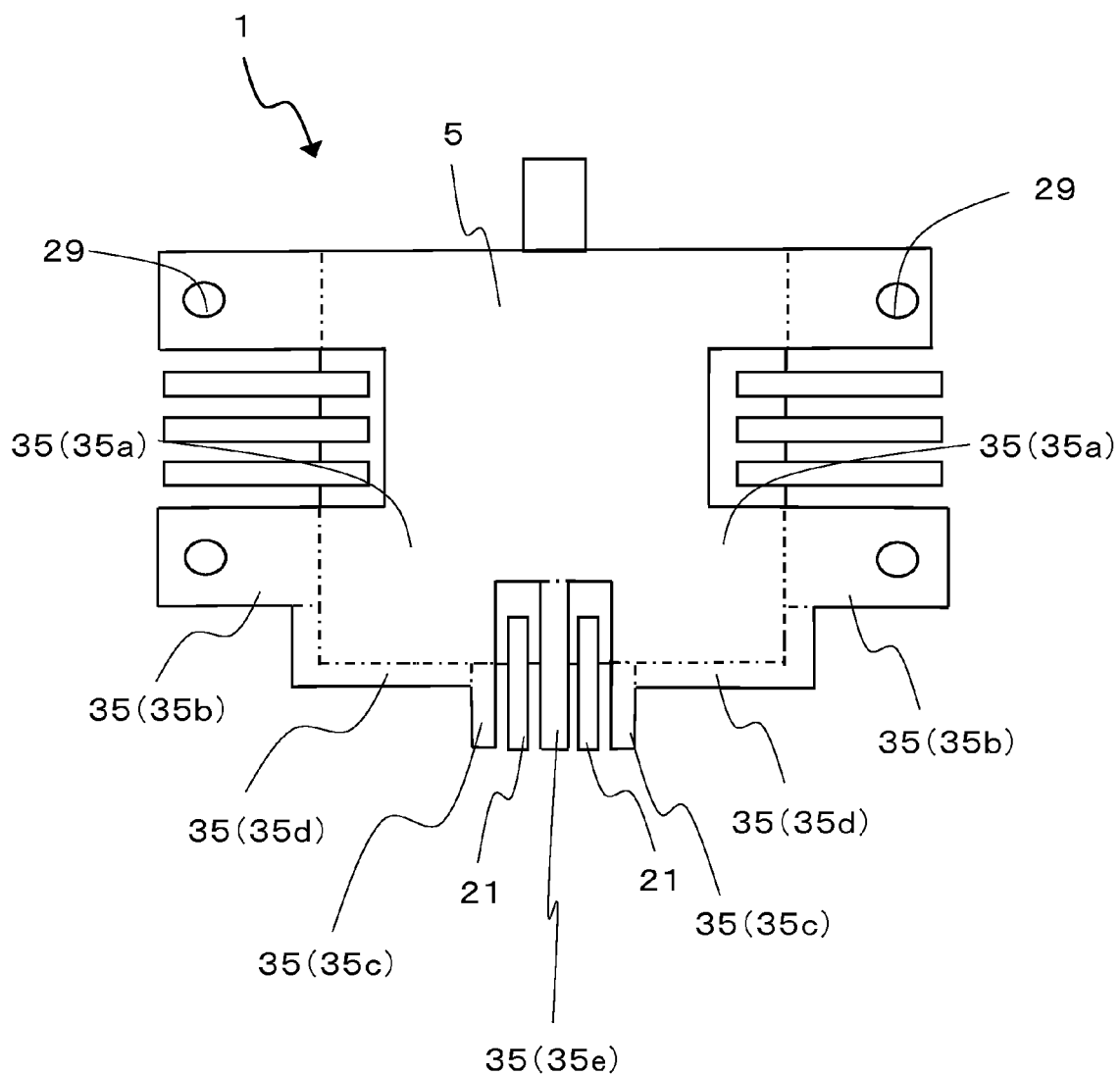
FIG. 5 is a bottom view showing an element housing package according to a second embodiment.

Though two attachment members 13 and two metal plates 35 are separately provided in the package 1 shown in FIGS. 1 to 4, the invention is not limited to the structure. For example, as shown in FIG. 5, the attachment member 13 and the metal plate 35 may be integrally formed.

Since the attachment member 13 and the metal plate 35 are integrally formed in the package 1 according to the second embodiment, the strength of the metal plate 35 can be further improved. According to the structure, the possibility that the base body 5 is deformed can be further suppressed even when the package 1 is pressed against the mounting board 17. Therefore, the possibility that the circuit conductor 21 attached to the lower surface of the base body 5 is displaced to a position different from a desired position can be further suppressed.

The package 1 according to the second embodiment includes a plurality of circuit conductors 21. In the package 1 according to the second embodiment, the metal plate 35 further includes an auxiliary ground conductor region 35e which is positioned between the plurality of circuit conductors 21. Accordingly, it is possible to improve isolation characteristics between the plurality of circuit conductors 21. Moreover, the area of regions where the metal plate 35 touches the base body 5 can be increased as the metal plate 35 has the auxiliary ground conductor region 35e. As a result, the possibility that the base body 5 is deformed can be further suppressed.

The auxiliary ground conductor region 35e is drawn out laterally from the first side surface 51. Accordingly, the isolation characteristics between the plurality of circuit conductors 21 can be further improved.

In the package 1 according to the second embodiment, the auxiliary ground conductor region 35e is drawn out laterally from the first side surface 51, however, the invention is not limited to the structure. Specifically, the auxiliary ground conductor region 35e may be provided only between regions where the circuit conductors 21 are bonded to the lower surface of the base body 5.

The element housing package and the optical semiconductor device having the same according to respective embodiments have been described as the above, and the invention is not limited to the above embodiments. That is, various modifications and combination of the embodiments are possible without departing from the scope of the invention.

REFERENCE SIGNS LIST

1: Element housing package (package)
3: Semiconductor element
5: Base body
5a: Mounting region
7: Frame body
9: Connection conductor
13: Attachment member
17: Mounting board
19: Placing board
21: Circuit conductor
25: Wiring circuit
27: Ground wiring
29: Screwing hole
31: Bonding wire
33: Lid body
35: Metal plate
100: Component for semiconductor device
101: Semiconductor device

The invention claimed is:

1. An element housing package, comprising:
a base body having a rectangular shape when seen in a plan view, comprising a mounting region;
a frame body disposed on an upper surface of the base body so as to surround the mounting region;
a connection conductor disposed from the upper surface to a lower surface of the base body;
a circuit conductor disposed on the lower surface of the base body, one end of the circuit conductor being electrically connected to the connection conductor and another end of the circuit conductor being drawn out laterally from a first side surface of the base body; and
a metal plate disposed on the lower surface of the base body, comprising an attachment region and a ground conductor region, wherein the attachment region is drawn out laterally from a second side surface adjacent to the first side surface of the base body to be attached to a mounting board, and the ground conductor region is drawn out laterally from the first side surface of the base body being parallel to the circuit conductor,
the metal plate comprising an outer peripheral region which is drawn out laterally from the first side surface and the second side surface of the base body, from the ground conductor region to the attachment region along an outer periphery of the base body when seen in a plan view,
wherein the circuit conductor and the metal plate are mechanically separated and electrically insulated from each other, and
wherein the ground conductor region, the attachment region and the outer peripheral region are integrally formed.

2. The element housing package according to claim 1, wherein the metal plate is provided with a through hole in the attachment region to threadably attach the metal plate to the mounting board.

3. The element housing package according to claim 1, wherein a thickness of the metal plate is larger than a thickness of the circuit conductor.

4. The element housing package according to claim 1, wherein a plurality of circuit conductors are provided and the metal plate comprises an auxiliary ground conductor region positioned between the plurality of circuit conductors.

5. A component for a semiconductor device, comprising:
the element housing package according to claim 1; and
the mounting board for mounting the element housing package thereon by attaching the attachment region to the mounting board.

6. A semiconductor device, comprising:
the component for a semiconductor device according to claim 5;
a semiconductor element mounted on the mounting region of the element housing package; and
a lid body bonded to an upper surface of the frame body.

* * * * *